(12) United States Patent
Nussbaum et al.

(10) Patent No.: US 9,419,607 B2
(45) Date of Patent: Aug. 16, 2016

(54) GATE DRIVE CIRCUIT

(71) Applicant: Bose Corporation, Framingham, MA (US)

(72) Inventors: Michael B. Nussbaum, Newton, MA (US); Zoran Coric, Framingham, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 14/590,306

(22) Filed: Jan. 6, 2015

(65) Prior Publication Data

US 2016/0197605 A1 Jul. 7, 2016

(51) Int. Cl.
  *H03F 3/217* (2006.01)
  *H03K 17/687* (2006.01)
  *H03K 3/013* (2006.01)
  *H03F 3/185* (2006.01)

(52) U.S. Cl.
  CPC .............. *H03K 17/687* (2013.01); *H03F 3/185* (2013.01); *H03K 3/013* (2013.01); *H03F 2200/03* (2013.01)

(58) Field of Classification Search
  CPC ...... H03F 3/217; H03F 3/2171; H03F 3/2173
  USPC ............ 330/10, 207 A, 251; 323/282; 363/41
  See application file for complete search history.

(56) References Cited

U.S. PATENT DOCUMENTS

| | | | |
|---|---|---|---|
| 3,931,581 A | 1/1976 | Kush et al. | |
| RE28,851 E | 6/1976 | Milkovic | |
| 4,107,771 A | 8/1978 | Anderson et al. | |
| 4,554,512 A | 11/1985 | Aiello | |
| 6,169,681 B1 * | 1/2001 | Kemp, III | H02M 3/337 363/134 |
| 6,300,829 B1 | 10/2001 | Luu | |
| 8,610,533 B2 | 12/2013 | Nussbaum | |
| 2002/0141206 A1 | 10/2002 | Brkovic | |
| 2012/0249105 A1 | 10/2012 | Nussbaum | |

FOREIGN PATENT DOCUMENTS

EP 0 246 377 11/1987

OTHER PUBLICATIONS

Ghislanzoni et al., "A DC Current Transformer for Large Bandwidth and High Common-Mode Rejection," IEEE Transactions on Industrial Electronics, vol. 46, No. 3, Jun. 1999, p. 631-636.

(Continued)

*Primary Examiner* — Steven J Mottola
(74) *Attorney, Agent, or Firm* — Fish & Richardson P.C.

(57) ABSTRACT

Example circuitry includes: a transformer circuit having first windings and second windings, where the second windings are magnetically orthogonal to the first windings; first transistors to provide a first voltage to a load, where each of the first transistors is responsive to a first control signal that is based on a first signal through a first winding; second transistors to provide a second voltage to the load, where each of the second transistors is responsive to a second control signal that is based on the first through the first winding, and where the first and second control signals cause the first transistors to operate in a different switching state than the second transistors; and control circuitry responsive to signals received through the second windings to control the first transistors and the second transistors to operate in a same switching state.

20 Claims, 11 Drawing Sheets

(56) References Cited

OTHER PUBLICATIONS

Caruso et al., "A New Perspective on Magnetic Field Sensing" Honeywell, SSEC and Nonvolatile Electronics, Inc., May 1998, 19 pgs.

McNeill et al., "Active Current Transformer Circuits for Low Distortion Sensing in Switched Mode Power Converters," IEEE Transactions on Power Electronics, vol. 19, No. 4, Jul. 2004, p. 908-917.

Lyra et al., "Coaxial Current Transformer for Test and Characterization of High-Power Semiconductor Devices Under Hard and Soft Switching," IEEE Transactions on Industry Applications, vol. 36, No. 4, Jul./Aug. 2000, p. 1181-1188.

Ripka, "Current Sensors Using Magnetic Materials," Journal of Optoelectronics and Advanced Materials vol. 6, No. 2, Jun. 2004, p. 587-592.

B. Vojnovic, "Extending the low-frequency response of pulse transformers," Gray Cancer Institute 2005, 3 pgs.

Drafts et al., "New Magnetoresistive Current Sensor Improves Power Electronics Performance," F. W. Bell (a Div. of Bell Technologies Inc.) HTML Document dated Jan. 21, 2008.

Dalessandro et al., "High-Performance Planar Isolated Current Sensor for Power Electronics Applications," IEEE Transactions on Power Electronics, vol. 22, No. 5, Sep. 2007, p. 1682-1692.

Karrer et al., "A new current measuring principle for power electronic applications," Electrical Engineering and Design Lab (EEK) Swiss Federal Institute of Technology, Zurich, IEEE 1999 p. 279-282.

Feucht, "Isolated DC Current Sensing," Circuit Design Clinic Jul. 2006, 5 pgs.

Smith et al., "Low-Field Magnetic Sensing with GMR Sensors," Nonvolatile Electronics, Inc., 13 pgs, May 1999.

Clark, "CMOS Magnetic Sensor Arrays," IEEE, Division of Applied Sciences, Harvard University, 1988, 4 pgs.

D'avalos-Santana et al., "A 540$^1$T¡ 1 silicon-based MAGFET," Instrumentacion, Revista Mexicana De Fi'Sica 53 (3) 218-221 (Jun. 2007).

"Magneto-Resistive Current Sensors for Peak Currents up to 150 A," NT Series, F.W. Bell, Sypris Test & Measurement (Apr. 2003), 4 pgs.

Lin et al., "Single-Wire Current-Share Paralleling of Current-Mode-Controlled DC Power Supplies," IEEE Transaction on Industrial Electronics, vol. 47, No. 4, Aug. 2000, p. 780-786.

Mammano, "Current Sensing Solutions for Power Supply Designers," Texas Instruments Incorporated (2001), p. 1-1-1-34.

Patel, "Current Measurement in Power Electronic and Motor Drive Applications—A Comprehensive Study," Thesis, Graduate School of the University of Missouri-Rolla, Master of Science in Electrical Engineering (2007), 123 pgs.

Hewson et al., "Verification of Rogowski Current Transducer's Ability to Measure Fast Switching Transients," IEEE 2006 p. 573-579.

Ray et al., "High Frequency Effects in Current Measurement Using Rogowski Coils," Power Electronic Measurements Ltd., EPE 2005—Dresden ISBN : 90-75815-08-5, 9 pgs.

Ray, "A 4000Arms High Stable Calibration Current Source," Power Electronic Measurements Ltd., EPE 1999, 10 pgs.

Ray et al., "High Frequency Improvements in Wide Bandwidth Rogowski Current Transducers," Power Electronic Measurements Ltd., EPE 1999—Lausanne, 9 pgs.

"CWT Ultra Miniature Specification," Power Electronics Measurements Ltd. (Feb. 2007).

"CWT Ultramini Performance Characteristics," May 2003, 1 pg.

Ray et al., "High Performance Rogowski Current Transducers," Power Electronics Measurements Ltd. (2000), 8 pgs.

Ray et al., "Coil and Cable Behaviour for Rogowski Current Transducers," Power Electronic Measurements Ltd., EPE 2001—Graz, 13 pgs.

International Search Report and Written Opinion; PCT/US2016/012109; Feb. 29, 2016; 13 pp.

Argueso et al., "Measurement of high frequency currents with a Rogowski coil," Department of Electrical Engineering, E.P.S. Universidad Carlos III de Madrid, 5 pgs; 2005.

Hewson et al., "The effect of electrostatic screening of Rogowski coils designed for wide-bandwidth current measurement in power electronic applications," Power Electronics Measurements Ltd., 6 pgs.; 2004.

Jalebi et al., "Real Time Rotor Bar Current Measurements Using a Rogowski Coil Transmitted Using Wireless Technology," Engineering Department, University of Cambridge, Cambridge, UK, 9 pgs.; 2003.

Shepard et al., "An Overview of Rogowski Coil Current Sensing Technology," LEM DynAmp Inc., Grove City, OH, 13 pgs.; 2000.

Favre et al., "Current Sensing in Electric Drives A Future and History Based on Multiple Innovations," LEM Group, Switzerland, 8 pgs., 2005.

"Magnetoresistive Current Sensor, Mixed Signal ASIC doubles Turnover in one Year," FUSE demonstrator document FUSE Application Experiment EPC1 EU Nr. 24744, Monitoring TTN: IAM F&E GmbH, Braunschweig, Germany, 26 pgs; 2001.

\* cited by examiner

GATE DRIVE CIRCUIT

TECHNICAL FIELD

This disclosure relates generally to a gate drive circuit.

BACKGROUND

A gate drive circuit may be used to drive semiconductor switches (e.g., transistors) that drive a load, which may be part of a switching amplifier. For example, the gate drive circuit may control operation of sets of transistors to provide power to the load.

SUMMARY

Example circuitry may include: a transformer circuit having first windings and second windings, where the second windings are magnetically orthogonal to the first windings; first transistors to provide a first voltage to a load, where each of the first transistors is responsive to a first control signal that is based on a first signal through a first winding; second transistors to provide a second voltage to the load, where each of the second transistors is responsive to a second control signal that is based on the first signal through the first winding, and where the first and second control signals cause the first transistors to operate in a different switching state than the second transistors; and control circuitry responsive to signals received through the second windings to control the first transistors and the second transistors to operate in a same switching state. The example circuitry may include one or more of the following features, either alone or in combination.

A control circuit may be between each first winding and each first and second transistor, where each circuit may be configured to generate either the first control signal or the second control signal. The control circuitry may include circuits, each of which may be between a secondary winding and a corresponding transistor.

The first transistors may include a first transistor connected between the first voltage and the load and a second transistor connected between the load and a reference voltage. The second transistors may include a third transistor connected between the first voltage and the load and a fourth transistor connected between the load voltage and the reference voltage. The first transistor and the fourth transistor may be operational in a same switching state to apply the first voltage to the load, and the second transistor and the third transistor may be operational in a same switching state to apply the second voltage to the load, where the second voltage is equal in magnitude and opposite in polarity to the first voltage. The first transistor and the fourth transistor may be conductive while the second transistor and the third transistor are not conductive, and the first transistor and the fourth transistor may not be conductive while the second transistor and the third transistor are conductive. The first transistor, the second transistor, the third transistor, and the fourth transistor may be field effect transistors (FETs), with each FET having a control terminal for receiving either the first control signal or the second control signal.

The control circuitry may be configured to generate a third control signal that is applicable to gates of the first and second transistors. Control of the first transistors and the second transistors to be in a same switching state may occur, at most, within 200 nanoseconds of a command instructing that the transistors operate in a same switching state. Control of the first transistors and the second transistors to be in a same switching state may occur, at most, within 100 nanoseconds of a command instructing that the transistors operate in a same switching state.

The example circuitry may include compensation circuitry to reduce noise resulting from lack of symmetry in magnetic structures making up the transformer circuit. The first windings and the second windings may be secondary windings of a transformer circuit having at least one primary winding. The transformer circuit may include a main primary winding and an orthogonal primary winding, with the main primary winding for inducing signals in the first windings and the orthogonal primary winding for inducing signals in the second windings. The load may be part of an audio amplifier. The control circuitry may be configured to override the first control signal and the second control signal to cause the first transistors and the second transistors to be in a same switching state. The control circuitry may be configured to override the first control signal and the second control signal to cause the first transistors and the second transistors to be non-conductive.

Example circuitry may include: a transformer circuit having first windings and second windings, where the second windings are magnetically orthogonal to the first windings; and control circuitry (i) responsive to signals in the first windings, to cause application of a first voltage and a second voltage to a load, where the application of the first voltage and the second voltage is applied at different times and in opposite polarity, and (ii) responsive to signals in the second windings to prevent application of either the first voltage or the second voltage to the load. The example circuitry may include one or more of the following features, either alone or in combination.

The example circuitry may include switches that are controllable based on the signals in the first windings to enable application of either the first voltage or the second voltage to the load. The switches may also be controllable to open based on the signals in the second windings, thereby preventing application of either the first voltage or the second voltage to the load. The first and second windings may be secondary windings of the transformer circuit, and the transformer circuit may have one or more primary windings to receive control signals for controlling the circuitry.

Example circuitry may include: a transformer circuit having first windings and second windings, with the second windings being magnetically orthogonal to the first windings; means responsive to first control signals that are based on first signals through first windings to provide a first voltage to a load; means responsive to second control signals that are based on the first signals through the first windings to provide a second voltage to the load, where the first control signals and the second controls signal cause output of the first voltage to be opposite in polarity to the second voltage; and means responsive to third signals received via second windings to override the first signals to cease output of the first voltage or the second voltage from the circuitry.

Two or more of the features described in this disclosure/specification, including this summary section, can be combined to form implementations not specifically described herein.

The circuitry described herein, or portions thereof, can be controlled by a computer program product that includes instructions that are stored on one or more non-transitory machine-readable storage media, and that are executable on one or more processing devices. The systems and techniques described herein, or portions thereof, can be implemented as an apparatus, method, or electronic system that can include one or more processing devices and memory to store executable instructions to control the circuitry described herein.

The details of one or more implementations are set forth in the accompanying drawings and the description below. Other features, objects, and advantages will be apparent from the description and drawings, and from the claims.

DESCRIPTION OF THE DRAWINGS

Like reference symbols in the various drawings indicate like elements.

DETAILED DESCRIPTION

Figure 1:
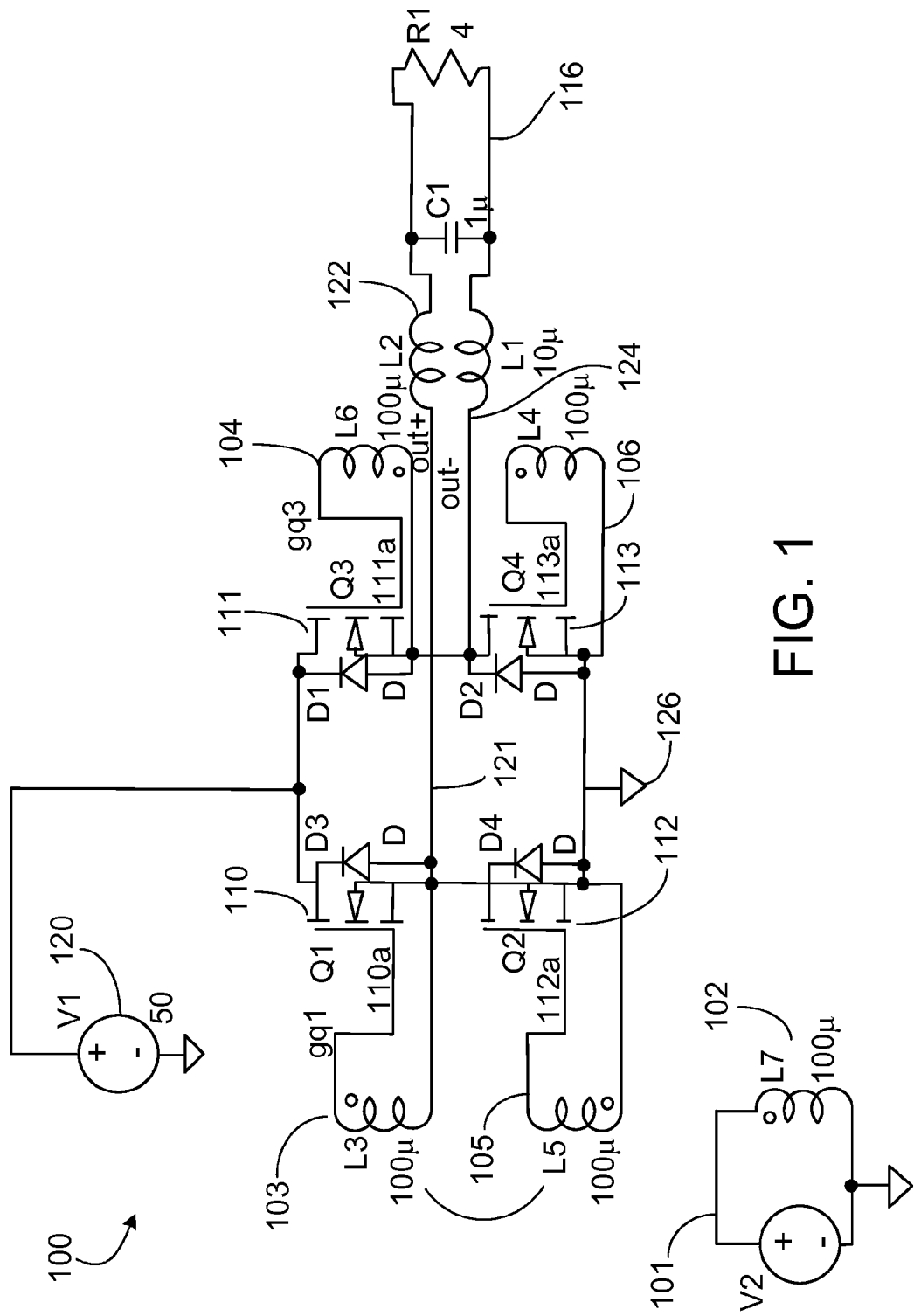
FIG. 1 is a circuit diagram including an example gate drive circuit.

FIG. 1 shows example of circuitry 100, which includes a gate drive circuit, switches driven by the gate drive circuit, and an associated load. Circuitry 100 includes a transformer circuit, in this example, transformer 101 having primary winding 102 and secondary windings 103, 104, 105, 106. In this example, four transistors 110, 111, 112, 113 are used to drive a load 116, here an RLC (resistive-capacitive-inductive load). Transistors 110, 111, 112, 113 are metal oxide field-effect transistors (MOSFETs); however, any appropriate type of transistor may be used (e.g., bipolar junction transistors (BJTs) or IGBT's). A single pulse command into the primary winding of the transformer simultaneously provides outputs to gate drive circuitry for all switching transistors.

Transistor 110 has a drain connected to the high side terminal of voltage source V1 120, and a source connected to a first terminal 121 of output circuit 122. Transistor 111 has a drain connected to the high side terminal of voltage source V1 120, and a source connected to a second terminal 124 of output circuit 122. Transistor 112 has a drain connected to top terminal 121 of output circuit 122, and a source connected to a reference, in this example, ground 126. Transistor 113 has a drain connected to bottom terminal 124 of output circuit 122, and a source connected to a reference, in this example, ground 126.

Figure 2:
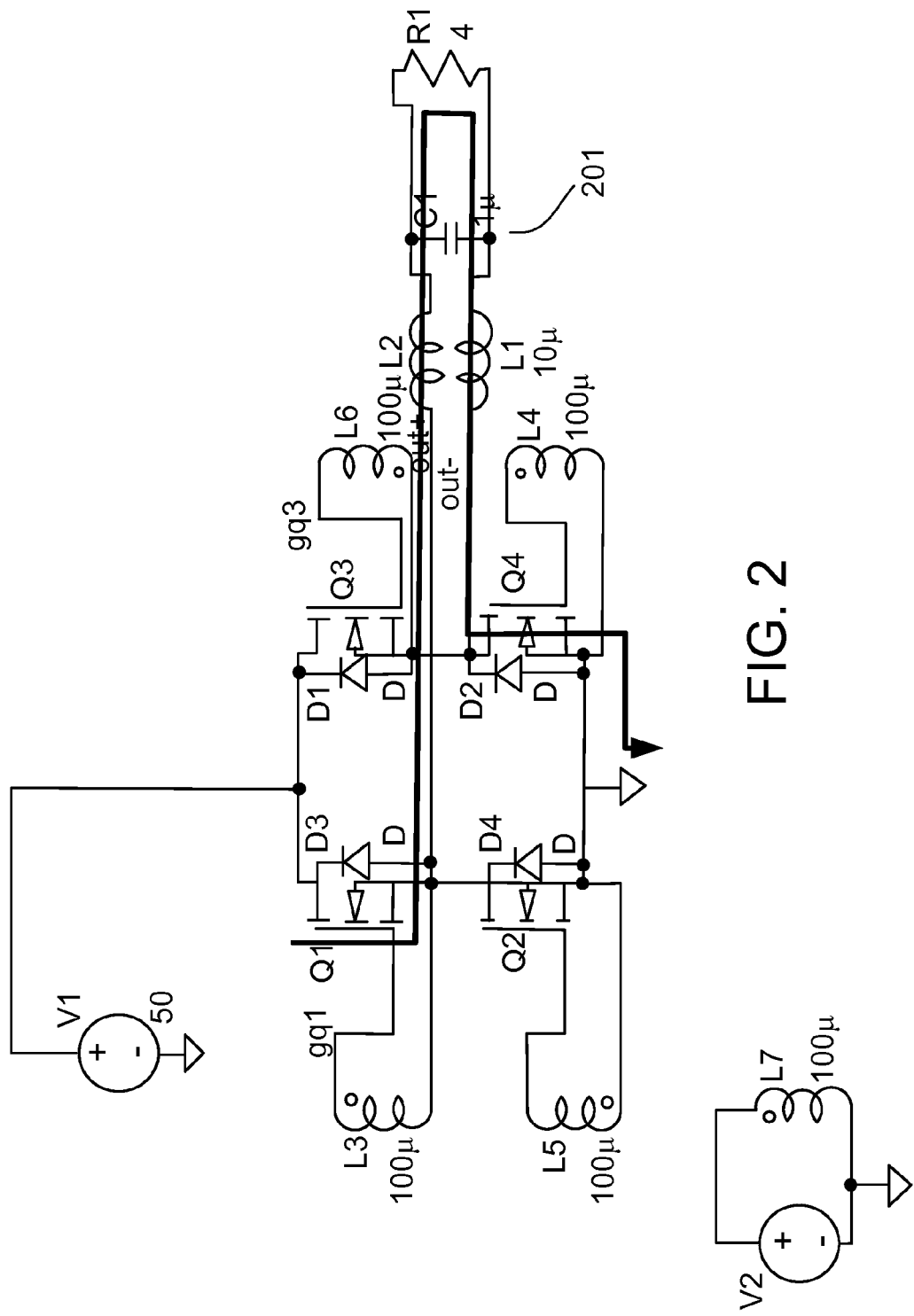
FIGS. 2 and 3 are circuit diagrams showing current paths through the example circuitry of FIG. 1 in different modes of operation.
Figure 3:
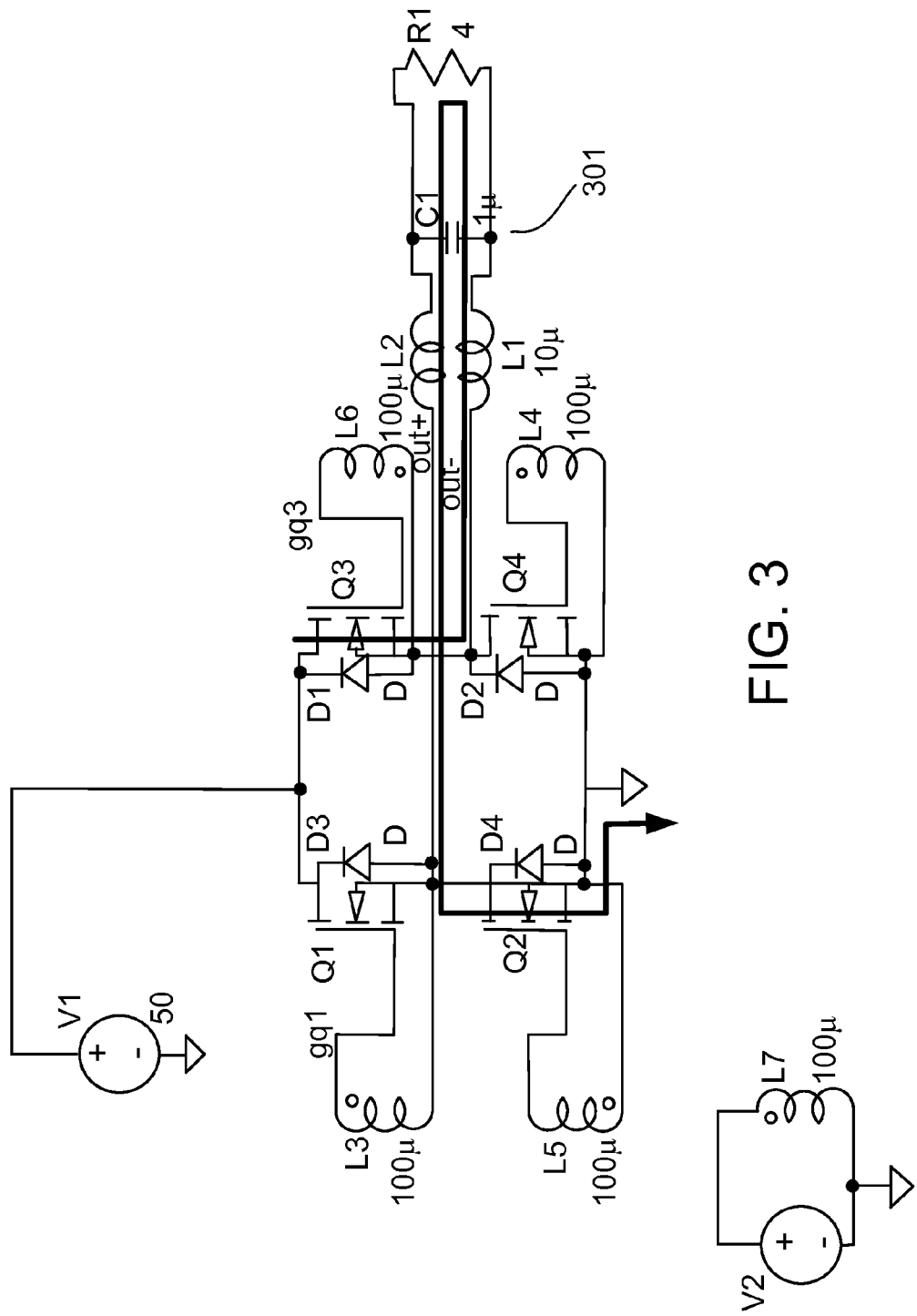

Transistors 110, 111, 112, 113 also have control terminals, namely respective gates 110a, 111a, 112a, 113a. Applying an appropriate voltage to a gate drives the corresponding transistor to conduction, thereby allowing current to flow between source and drain. In this example, gate 110a is controlled by applying a signal from secondary winding 103, gate 111a is controlled by applying a signal from secondary winding 104, gate 112a is controlled by applying a signal from secondary winding 105, and gate 113a is controlled by applying a signal from secondary winding 106. In one state of operation shown in FIG. 2, transistors 110 and 113 are driven to conduction (with transistors 111 and 112 non-conducting), thereby creating an electrical path 201 from voltage V1 120, through transistor 110, through load 116, through transistor 113, to ground 126. In another state of operation shown in FIG. 3, transistors 111 and 112 are driven to conduction (with transistors 110 and 113 non-conducting), thereby creating an electrical path 301 from voltage V1 120, through transistor 111, through load 116, through transistor 112, to ground 126. Thus, voltages applied to the load in the different switching states are opposite in polarity.

Transistors 110, 111, 112, 113 are controlled by transformer 101. In this example, secondary windings 103, 106 are opposite in orientation to secondary windings 104, 105. When primary winding 102 is excited with a positive voltage with respect to the dot, secondary windings 103, 106 will have a positive voltage (with respect to the dot) induced in them. This will put a positive voltage on gates 110a, 113a, causing transistors 110, 113 to conduct. That same signal results in a negative voltage being applied to the gates 111a and 112a, and, as a result, transistors 111, 112 do not conduct. This results in current flow along path 201 of FIG. 2. When primary winding 102 is controlled to have a negative voltage with respect to the dot, secondary windings 104, 105 will have a negative voltage (with respect to the dot) induced in them. This will put a positive voltage on to gates 111a, 112a, causing transistors 111, 112 to conduct. That same signal results in a negative voltage being applied to gates 110a and 113a and, as a result, transistors 110, 114 do not conduct. This results in current flow along path 301 of FIG. 3.

Circuitry 100, however, does not provide a mechanism for quickly turning-off (e.g., preventing conduction through) all four transistors 110, 111, 112, 113 at the same time or at about the same time. In some cases, a significant amount of additional circuitry may be included to turn-off all transistors at the same time as part of the gate drive circuit. A downside to this approach is that this amount of additional circuitry increases overall circuit complexity and system cost. By contrast, the examples described herein, which use orthogonal windings, may be simpler, smaller, less expensive, and require less additional circuitry.

Turning-off all four transistors can be beneficial in response to fault conditions, or at normal shutdown to reduce transient noise generation. In this regard, it may be possible to provide no signal through primary winding 102, which will eventually result in all transistors settling into a non-conductive state. However, if transistors are conducting, removal of the signal from the primary winding may not result in the transistors transitioning to a non-conductive state quickly enough. Instead, there can be a lag, during which time the conducting transistors remain at least partly conductive. In this regard, it takes time for their gate drive to drop sufficiently to allow the devices to open. This time is uncontrolled, and possible unwanted states may exist (such as having all transistors conducting). Also, uncontrolled gate drive voltage might result in an intermediate drive being applied for a short period of time placing the transistors in a partially conducting state. This can damage or destroy the devices as large power may be dissipated in the transistors.

A transformer having orthogonal windings may be incorporated into a gate drive circuit, such as that included in FIG. 1, to turn-off all transistors controlled by the gate drive circuit at about the same time. The orthogonality of the windings, as described below, can ensure the orthogonal inputs and corresponding outputs do not interfere with each other. As described below, in example implementations, there are multiple primary and corresponding secondary windings in the transformer. One set of primary and corresponding secondary windings (a first set) is orthogonal to another set of primary and corresponding secondary windings (a second set). Thus, inputs and corresponding outputs of the first set to do interfere, or substantially interfere, with inputs and corresponding outputs of the second set For example, an input to a primary winding of the second set (e.g., a turn off pulse) results in output signals in secondary windings of the second set to drive gate turn-off circuitry, but does not produce outputs in any of the windings of the first set. Similarly, in this example, an input to a primary winding of the first set results in output signals in secondary windings of the first set, but does not produce outputs in any of the windings of the second set.

In an example implementation, the transformer having orthogonal windings may include two magnetic circuits wound around a single E-core, which are configured to operate relatively independently. In the examples described herein, the "orthogonal" part of transformer is configured to produce one or more signals that are used to operate all transistors in a same switching state, e.g., to enable all of the transistors to be turned-off at about the same time.

In some implementations, the responsiveness to signals produced by the orthogonal windings may be on the order of tens or hundreds of nanoseconds (ns). For example, in some implementations, the transistors may be turned off (e.g., driven to non-conduction) within that period. In some implementations, the transistors all may be turned-off within 200 ns, 100 ns, 50 ns, or less following application of a turn off command signal to the transformer. In other implementations, the transistors may be turned-off within a different period of time that is greater than 200 ns. Thus, the use of orthogonal windings and the gate drive circuit described herein may result in a reduced turn-off time compared to the case if a signal is simply removed from the primary winding of the transformer, which could result in turn-off times in 100 s of µs to 100 s of ms.

Figure 4:
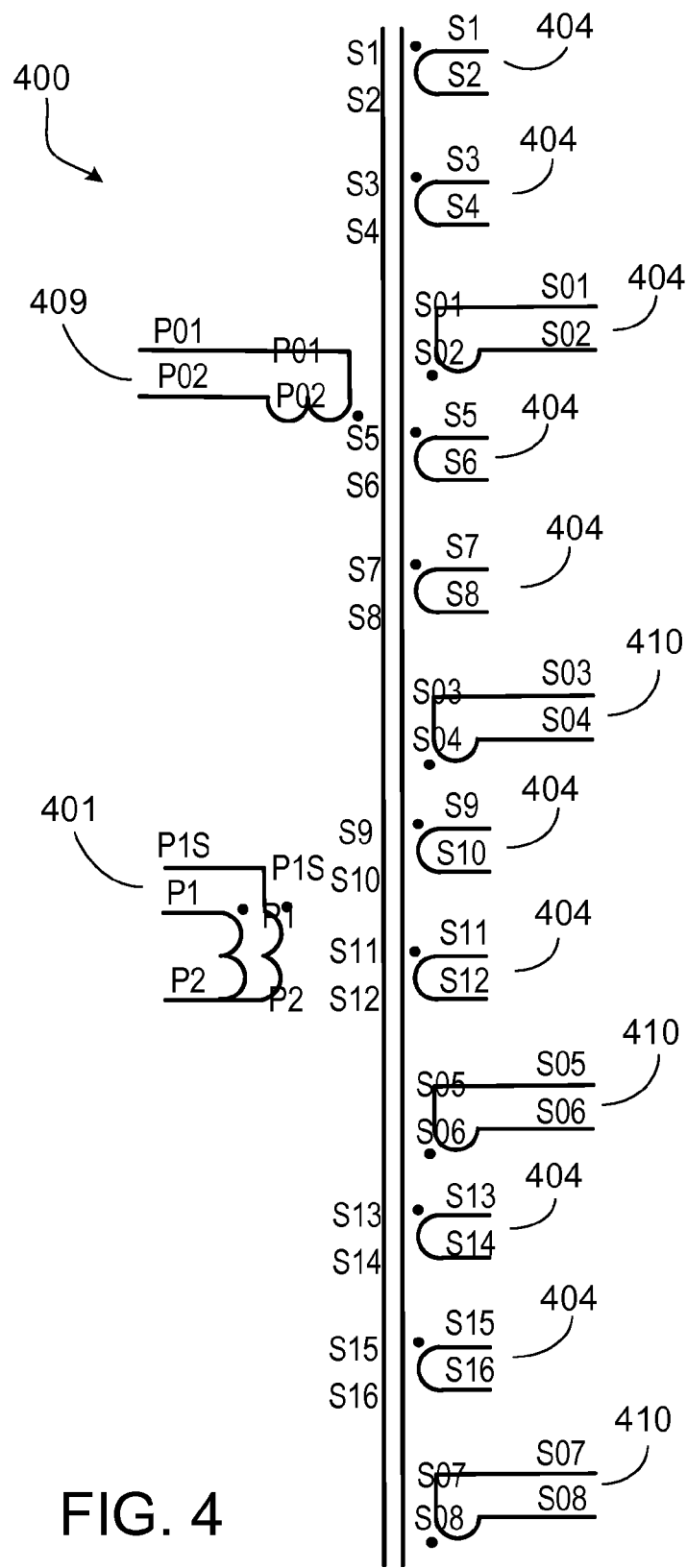
FIG. 4 is a circuit diagram of a transformer circuit having main and orthogonal windings that may be incorporated into a gate drive circuit.

Referring, to FIG. 4, an example transformer circuit, including transformer 400, that may be used in a gate drive circuit is shown. In this example, transformer 400 includes primary windings 401. Primary windings 401 are designated as primary main windings, since signals sent through those windings induce signals in corresponding secondary main windings to control the operation of a first set of transistors and a second set of transistors so that the first set of transistors are operational (e.g., conductive) when the second set of transistors are non-operational (e.g., non-conductive), and vice versa. In this example, transformer 400 includes secondary windings 404. Secondary windings 404 are designated as secondary main windings, since signals in those windings are induced by signals the primary main windings to control the operation of the first set of transistors and the second set of transistors so that the first set of transistors are operational (e.g., conductive) when the second set of transistors are non-operational (e.g., non-conductive), and vice versa.

In the example of FIG. 1 above, for example, transistors 110, 113 are driven to conduction when transistors 111, 112 are non-conductive, and transistors 111, 112 are driven to conduction when transistors 110, 113 are non-conductive. Thus, transistors 110, 111 and 112, 113 are operated in different switching states from each other by control signals generated via the main windings.

In this example, transformer 400 also includes primary winding 409. Primary winding 409 is designated as a primary orthogonal winding, since primary orthogonal winding 409 defines a magnetic flux path that is orthogonal (or substantially orthogonal) to the magnetic flux path of primary main windings 401. Signals sent through primary orthogonal winding 409 induce signals in corresponding secondary orthogonal windings to control the operation of transistors controlled by the gate drive circuit so that all transistors are in a same switching state. Secondary windings 410 are designated as secondary orthogonal windings, since each secondary orthogonal winding 410 is coupled to a magnetic flux path that is orthogonal to the magnetic flux path coupling secondary main windings 404. Signals in secondary orthogonal windings 410 are induced by signals in the primary orthogonal winding 409 to control the operation of all transistors to be in a same switching state. In this regard, in some implementations, all of the transistors controlled by the gate drive circuit are driven to a non-conducing state (a same switching state) by control signals generated via the orthogonal windings, thereby turning-off the gate drive circuit, and preventing an output from the corresponding controlled circuitry. Other types of switching state operation may also be commanded using the circuitry described herein or variants thereof.

Examples of the construction of transformers having orthogonal windings are described in U.S. patent application Ser. No. 13/076,923, filed on Mar. 31, 2011, which is incorporated herein by reference.

In the example implementations described herein, there may be little or no magnetic coupling between the main windings and the orthogonal windings. As such, each set can be operated independently without inducing significant voltages in the other set of windings. In some implementations, signals from the orthogonal windings override signals from the main windings. As described below, even if signals from the main windings instruct different switching state operation of different sets of transistors, if a signal from the orthogonal windings instructing a same switching state operation is generated, the signal from the orthogonal windings overrides the signals from the main windings, and causes in a same switching state operation of all transistors in the circuit.

Figure 5:
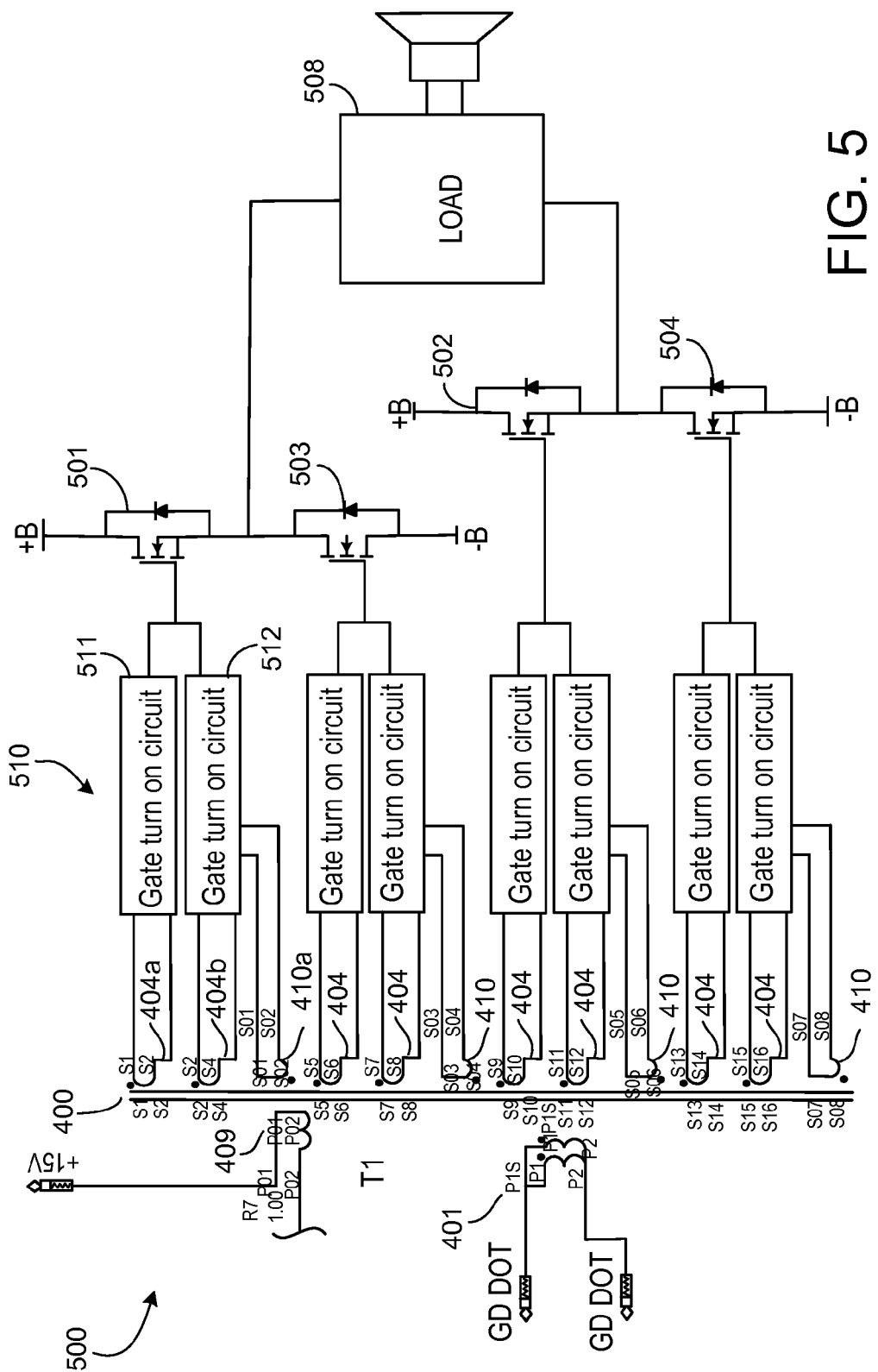
FIG. 5 is a circuit diagram including an example gate drive circuit that includes the transformer circuit of FIG. 4.

A transformer having orthogonal windings may be incorporated into circuitry such as that of FIG. 1, and operated in the manner described herein to control various switches, and turn all off, or operate all in a same switching state, at about the same time. For example, FIG. 5 shows example transformer 400 of FIG. 4 in an example circuitry 500, including a gate drive circuit, switches (e.g., transistors), and an associated load. However, the concepts described herein are not limited to use with the structures of transformer 400 or circuitry 500.

In the example of FIG. 5, primary main winding 401 is excited by a main pulse command associated with different switching state operation of transistors 501, 502, 503, 504. Primary orthogonal winding 409 is excited by a shutdown command, e.g., when this shutdown command is received, all four transistors 501, 502, 503, 504 are turned off (e.g., placed in an open circuit state) at about the same time (e.g., simultaneously). The orthogonal nature of these two sets of windings allows the main windings to command two of the gate drive signals applied to transistors to be in different switching states with the other two, while the orthogonal windings output voltages to all four gate drive circuits to apply gate drive signals to transistors with identical phase (and required magnitude to cause all transistors to enter a non-conducting state).

In the example implementation of FIG. 5, transistor 501 corresponds to transistor 110 of FIG. 1, transistor 502 corresponds to transistor 111 of FIG. 1, transistor 503 corresponds to transistor 112 of FIG. 1, and transistor 504 corresponds to transistor 113 of FIG. 1. Accordingly, in an example operation, transistors 501, 504 are driven to conduction while transistors 502, 503 are non-conductive; and transistors 502, 503 are driven to conduction while transistors 501, 504 are non-conductive. Thus, the operation of transistors 501, 502, 503, 504 when providing signals to load 508 (in this example, the load is included in an audio amplifier) is, conceptually, the same as the operation of transistors 110, 111, 112, 113 of FIG.

1 when providing signals to the load. For example, the voltage provided to the load via transistors 501, 504 is in different switching states from, and opposite in polarity to, the voltage applied to the load via transistors 502, 503. In the example of FIG. 5, the voltage references are +B and −B, which may be any appropriate different voltages, such as V1 and ground.

In the example implementation of FIG. 5, there is additional control circuitry electrically connected between each secondary winding and each corresponding transistor. Taking transistor 501 as an example, control circuitry 510 includes gate turn-on circuit 511 and gate turn-off circuit 512. In operation, gate turn-on circuit 511 generates a first control signal that is based on a signal through secondary main winding 404*a*. This first control signal is applied to the gate (the control terminal) of transistor 501 to drive transistor 501 to conduction. In operation, gate turn-off circuit 412 generates a second control signal that is based on a different signal through secondary main winding 404*b*. This second control signal is applied to the gate (the control terminal) of transistor 501 to cause transistor 501 not to conduct. The gate turn-on and gate turn-off circuits of FIG. 5 are operated to generate appropriate control signals for transistors 501, 502, 503, 504 so that transistors 501, 504 are conductive while transistors 502, 503 are not conductive, and so that transistors 502, 503 are conductive while transistors 501, 504 are not conductive (conceptually, the same manner of operation as the circuitry described with respect to FIG. 1).

In this example implementation, each gate turn-off circuit (e.g., gate turn-off circuit 512) is also responsive to a signal that is based on the output of a corresponding secondary orthogonal winding (e.g., winding 410*a*). In response to the signal from the secondary orthogonal winding, the gate turn-off circuit generates a control signal that overrides any control signal from gate turn-on circuit 511. This control signal from gate turn-off circuit 512 drives transistor 501 to a non-conductive state (e.g., turns-off transistor 501). In some implementations, each gate turn-off circuit (four shown in this example) generates a control signal at about the same time, responsive to the same signal through primary orthogonal winding 409, to operate its corresponding transistor in a same switching state will all other transistors controlled by the gate drive circuit (e.g., to turn off-each transistor at about the same time). As was the case above, in some implementations, the transistors all may be turned-off within 200 ns, 100 ns, 50 ns, or less following application of a signal to primary orthogonal winding 409 of the transformer 400. In other implementations, the transistors may be turned-off within a period of time that is greater than 200 ns.

In some implementations, a gate drive circuit employing primary and secondary orthogonal windings, such as the gate drive included in circuit 500, also includes compensation circuitry (not shown specifically in FIG. 5) to reduce noise in the orthogonal signals, which may result from lack of symmetry in magnetic structures comprising the transformers. For example, if there is more than a specified amount of asymmetry in the structure of a transformer, the magnetic flux path of the main windings may not be entirely orthogonal to the magnetic flux path of orthogonal windings. In this case, there may be stray signals, such as noise, induced in the main or orthogonal windings at inappropriate times, adversely affecting the operation of the gate drive circuit. The compensation circuit may be configured to reduce these stray signals or the effects of the stray signals, thereby compensating for the lack of symmetry in magnetic structures comprising the transformer.

Figure 6:
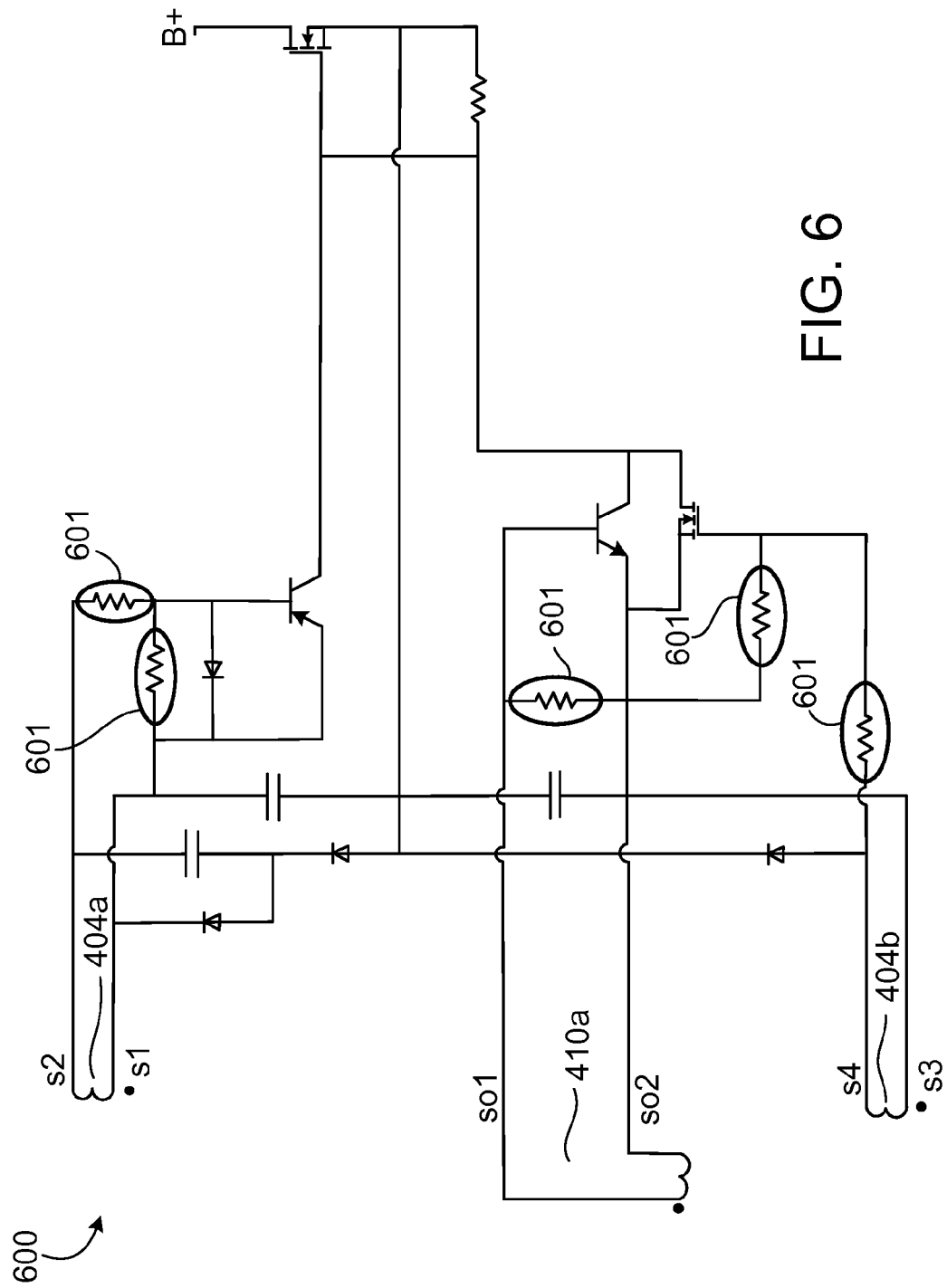
FIG. 6 is a circuit diagram of an example compensation circuit.

In this regard, FIG. 6 shows an example implementation of a portion 600 of circuitry 500 of FIG. 5, which includes a compensation circuit. In this example implementation, the compensation circuit includes resistors 601, which are selected and configured to set noise thresholds to filter out coupling resulting from stray fields. The stray fields may be caused by transformer windings that are not entirely orthogonal. Other types of compensation circuits may be used in addition to, or instead of, the example depicted in FIG. 6.

In some implementations, the load is, or includes, an audio amplifier or components thereof. However, the gate drive circuit may be used to drive switches to control any appropriate electrical or electro-mechanical load or loads.

FIGS. 7A through 7G show structures of an example orthogonal transformer that may be used in the circuitry described herein. However, the circuitry is not limited to use with the structures shown in FIGS. 7A through 7G, and may be used with any appropriate transformer structure.

Figure 7A:
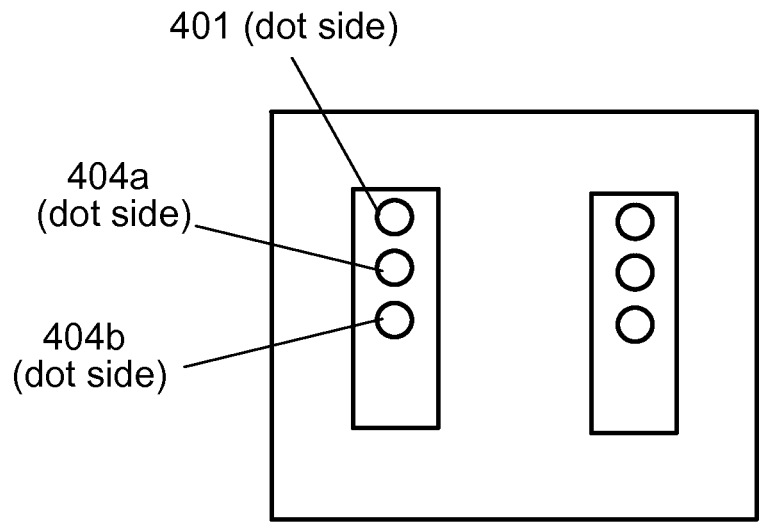
FIGS. 7A through 7G show structures of an example orthogonal transformer that may be used in the circuitry described herein.
Figure 7B:
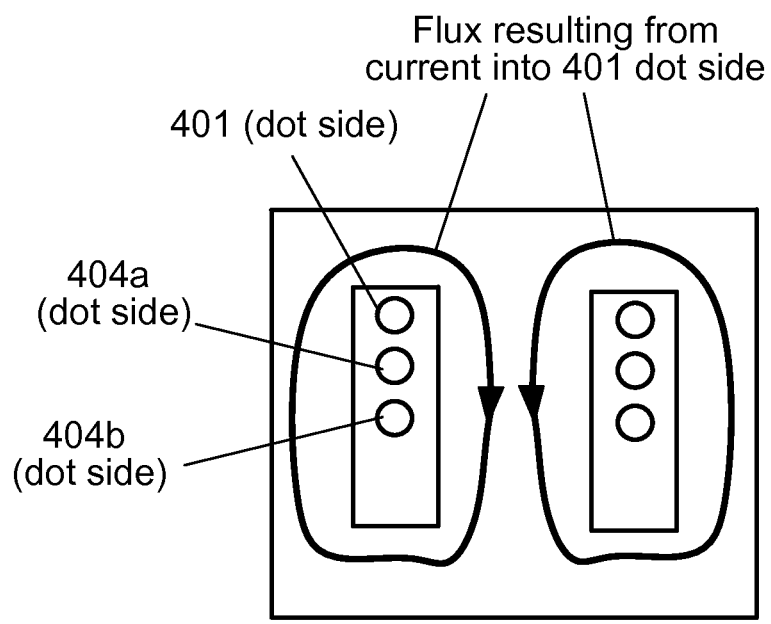

Referring to FIG. 7A, a conventional transformer is shown, which is represented in FIG. 5 by primary winding 401 ("primary") and secondary windings 404*a* and 404*b* ("secondaries") (other secondaries are shown in FIG. 5, but only one is depicted in FIG. 7A for simplicity). In operation, if current is forced into the dot side of primary 401 (thus is shown the tail of the arrow representing current), current will come out of the dot sides of secondaries 404*a* and 404*b* (thus is shown a point representing the tip of the current arrow). This reflects conventional transformer operation. Referring to FIG. 7B, the resulting flux path for this operation is shown.

Figure 7C:
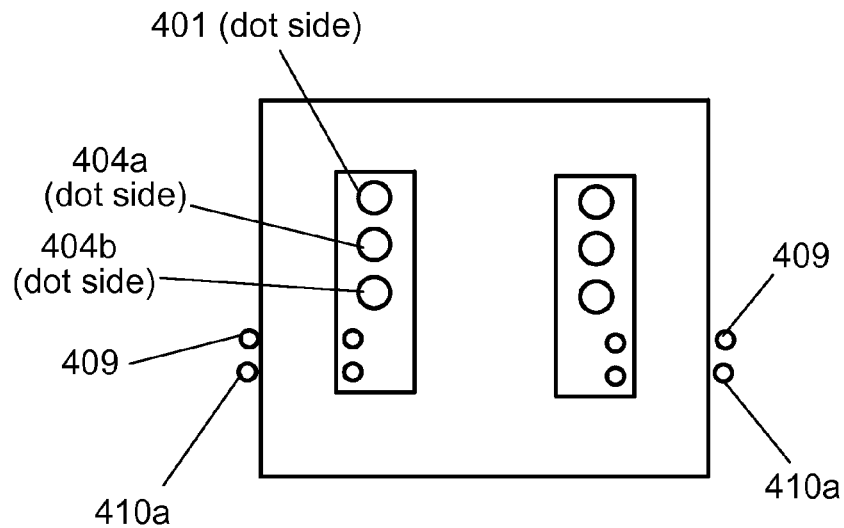
Figure 7D:
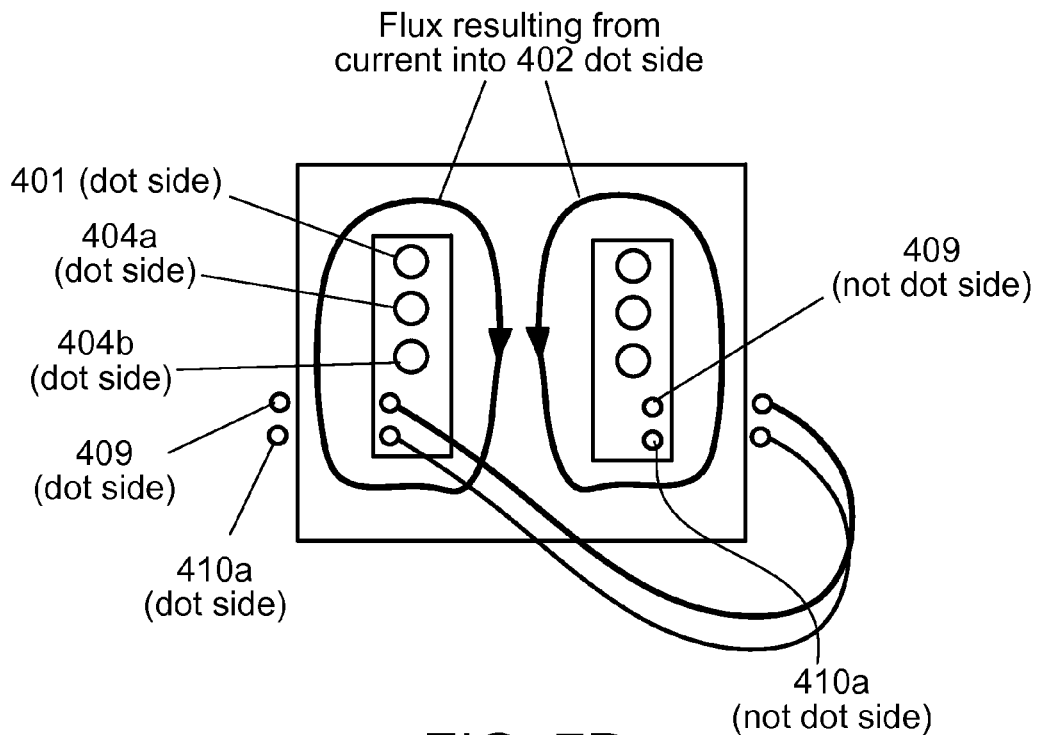

To the structure of FIG. 7A is added a set of a set of orthogonal windings, such as are represented by orthogonal primary 409 and orthogonal secondary 410*a* shown in FIG. 7C. Referring to FIG. 7D, assuming that the flux from primary 401 induced in the center leg of the transformer splits evenly between the two outer legs of the transformer, when the two windings which comprise 409 are connected as shown, the change in magnetic field (dB/dt) resulting from voltage applied across primary 401 induces equal and opposite EMFs in the two windings, such that the voltage seen across orthogonal primary 409 is zero. Likewise, the voltage seen across orthogonal secondary 410*a* is zero.

Figure 7E:
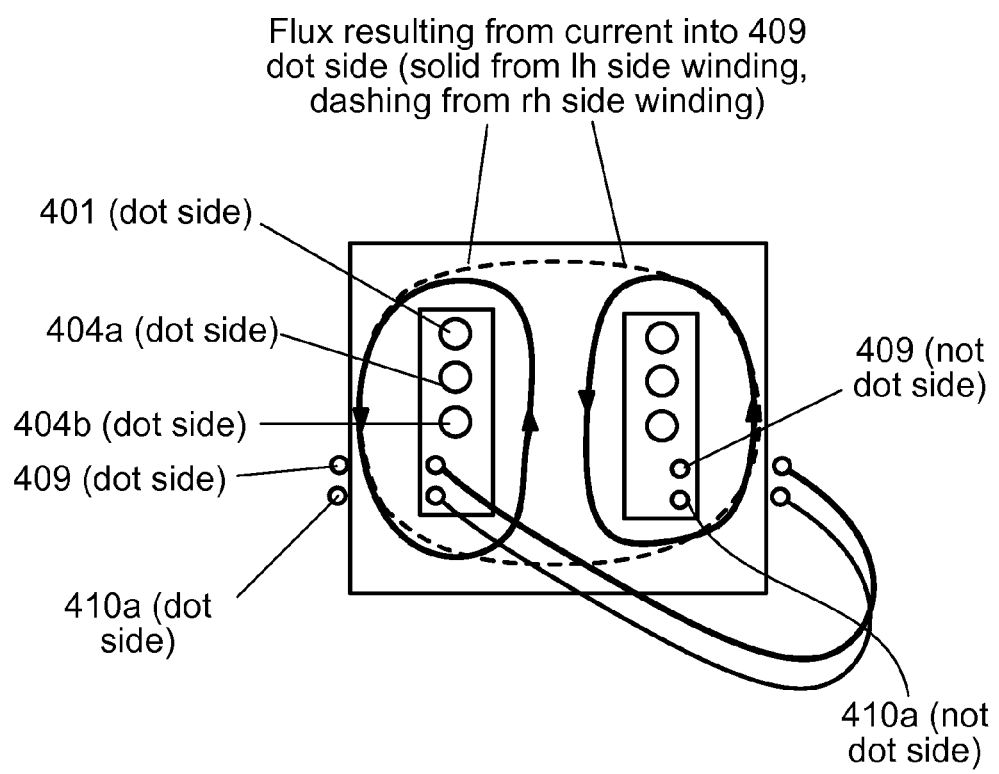
Figure 7F:
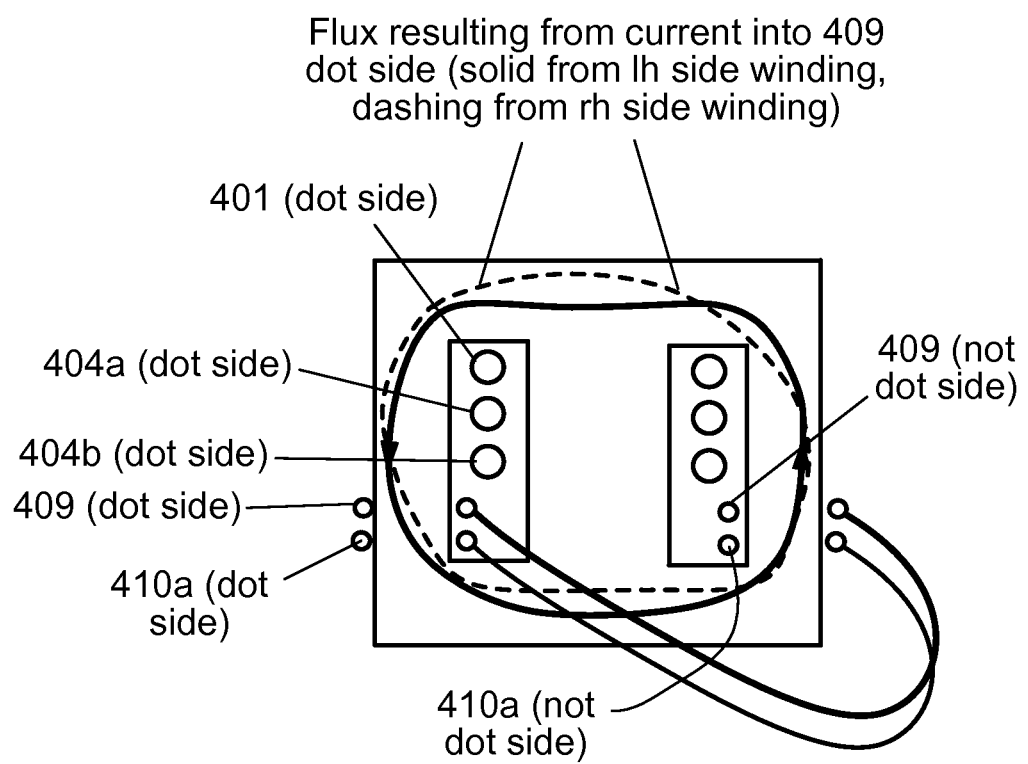

When current flows through orthogonal primary 409, the resulting flux is shown in FIG. 7E. It can be seen that the fluxes in the center lag cancel, while those in the outer legs reinforce, resulting in a net flux of FIG. 7F. Because there is no flux in the center leg resulting from current in orthogonal primary 409 or orthogonal secondary 410A, voltages applied to orthogonal primary 409 or orthogonal secondary 410*a* will not result in any voltage induced in windings 401, 404*a* or 404*b*. This is the reciprocal to the behavior described previously. Furthermore, windings 409 and 410*a* together comprise a transformer, e.g., if current flows into 409 on the dot side, current will flow out of 410 on the dot side, giving conventional transformer operation with the two windings coupled through the flux path shown in FIG. 7F. This results in the magnetic system coupling: 401, 404*a* and 404*b*; and 409 and 410*a*. Being orthogonal, these sets of windings are independent and can transmit information and power independent of one another.

Figure 7G:
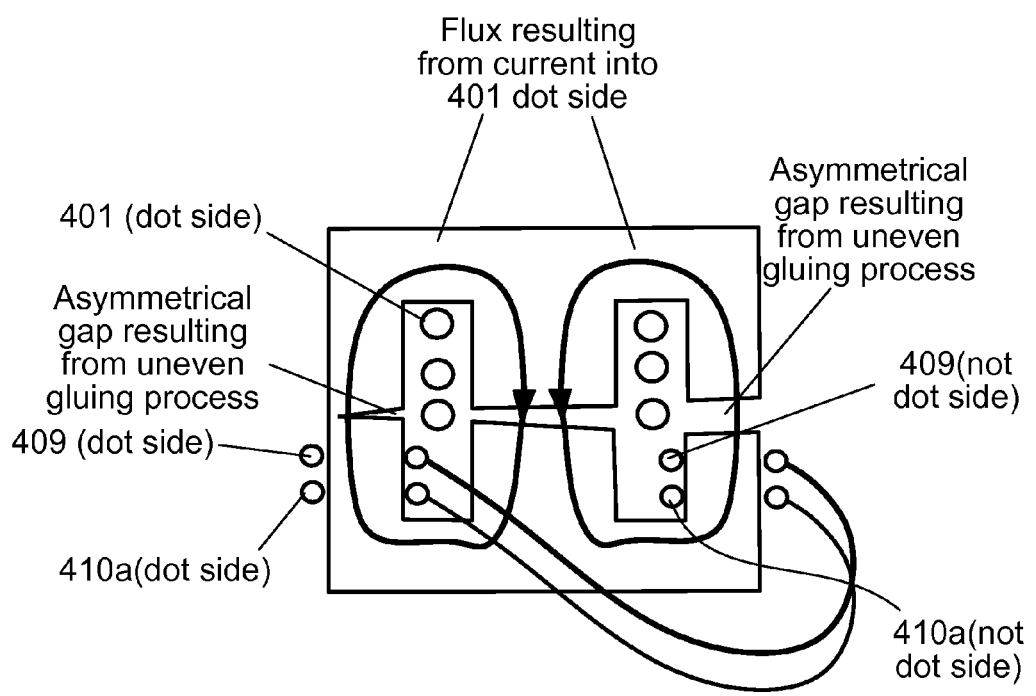

Referring to FIG. 7G, it can also be seen that if the transformer is not perfectly symmetrical, the center leg flux does not split exactly into the two outer legs. This asymmetry results in the two magnetic systems not being perfectly orthogonal, resulting in some bleed-through of signals between the two. Circuitry to filter or otherwise ignore this coupling is described with respect to FIG. 6.

The circuitry described above is not limited to the specific implementations described herein. For example, the transistors may be replaced with any appropriate circuitry or other controllable switch or switching element. There may be different numbers of primary main windings, secondary main windings, primary orthogonal windings, and secondary orthogonal windings than those described herein. There also may be different numbers of transistors, and they may be in different configurations, than in the example implementations described herein. Any appropriate control circuitry, and numbers of control circuits, may be used.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein can be combined to form other implementations not specifically set forth above.

Other implementations not specifically described herein are also within the scope of the following claims.

What is claimed is:

1. Circuitry comprising:
   a transformer circuit comprising first windings and second windings, the second windings being magnetically orthogonal to the first windings;
   first transistors to provide a first voltage to a load, each of the first transistors being responsive to a first control signal that is based on a first signal through a first winding;
   second transistors to provide a second voltage to the load, each of the second transistors being responsive to a second control signal that is based on the first signal through the first winding, wherein the first and second control signals cause the first transistors to operate in a different switching state than the second transistors; and
   control circuitry responsive to signals received through the second windings to control the first transistors and the second transistors to operate in a same switching state.

2. The circuitry of claim 1, further comprising:
   a control circuit between each first winding and each first and second transistor, each control circuit being configured to generate either the first control signal or the second control signal.

3. The circuitry of claim 1, wherein the control circuitry comprises circuits, each of which is between a secondary winding and a corresponding transistor.

4. The circuitry of claim 1, wherein the first transistors comprise a first transistor connected between the first voltage and the load and a second transistor connected between the load and a reference voltage;
   wherein the second transistors comprise a third transistor connected between the first voltage and the load and a fourth transistor connected between the load voltage and the reference voltage.

5. The circuitry of claim 4, wherein the first transistor and the fourth transistor are operational in a same switching state to apply the first voltage to the load, and the second transistor and the third transistor are operational in a same switching state to apply the second voltage to the load, the second voltage being equal in magnitude and opposite in polarity to the first voltage.

6. The circuitry of claim 5, wherein the first transistor and the fourth transistor are conductive while the second transistor and the third transistor are not conductive, and the first transistor and the fourth transistor are not conductive while the second transistor and the third transistor are conductive.

7. The circuitry of claim 6, wherein the first transistor, the second transistor, the third transistor, and the fourth transistor are field effect transistors (FETs), each of the FETs comprising a control terminal for receiving either the first control signal or the second control signal.

8. The circuitry of claim 1, wherein the control circuitry is configured to generate a third control signal that is applicable to gates of the first and second transistors.

9. The circuitry of claim 1, wherein control of the first transistors and the second transistors to be in a same switching state occurs, at most, within 200 nanoseconds of a command instructing that the transistors operate in a same switching state.

10. The circuitry of claim 1, wherein control of the first transistors and the second transistors to be in a same switching state occurs, at most, within 100 nanoseconds of a command instructing that the transistors operate in a same switching state.

11. The circuitry of claim 1, further comprising:
    compensation circuitry to reduce noise resulting from lack of symmetry in magnetic structures comprising the transformer circuit.

12. The circuitry of claim 1, wherein the first windings and the second windings are secondary windings of a transformer circuit having at least one primary winding.

13. The circuitry of claim 1, wherein the transformer circuit comprises a main primary winding and an orthogonal primary winding, the main primary winding for inducing signals in the first windings and the orthogonal primary winding for inducing signals in the second windings.

14. The circuitry of claim 1, wherein the load is part of an audio amplifier.

15. The circuitry of claim 1, wherein the control circuitry is configured to override the first control signal and the second control signal to cause the first transistors and the second transistors to be in a same switching state.

16. The circuitry of claim 1, wherein the control circuitry is configured to override the first control signal and the second control signal to cause the first transistors and the second transistors to be non-conductive.

17. Circuitry comprising:
    a transformer circuit comprising first windings and second windings, the second windings being magnetically orthogonal to the first windings; and
    control circuitry (i) responsive to signals in the first windings, to cause application of a first voltage and a second voltage to a load, the application of the first voltage and the second voltage being applied at different times and in opposite polarity, and (ii) responsive to signals in the second windings to prevent application of either the first voltage or the second voltage to the load.

18. The circuitry of claim 17, further comprising:
    switches that are controllable based on the signals in the first windings to enable application of either the first voltage or the second voltage to the load, the switches also being controllable to open based on the signals in the second windings, thereby preventing application of either the first voltage or the second voltage to the load.

19. The circuitry of claim 17, wherein the first and second windings comprise secondary windings of the transformer circuit, and wherein the transformer circuit comprises one or more primary windings to receive control signals for controlling the circuitry.

20. Circuitry comprising:

a transformer circuit comprising first windings and second windings, the second windings being magnetically orthogonal to the first windings;

means responsive to first control signals that are based on first signals through first windings to provide a first voltage to a load;

means responsive to second control signals that are based on the first signals through the first windings to provide a second voltage to the load, wherein the first control signals and the second controls signal cause output of the first voltage to be opposite in polarity to the second voltage; and means responsive to third signals received via second windings to override the first signals to cease output of the first voltage or the second voltage from the circuitry.

* * * * *